(12) United States Patent
Li et al.

(10) Patent No.: US 10,660,212 B2
(45) Date of Patent: May 19, 2020

(54) ELEMENT SUBMOUNT AND METHOD FOR MANUFACTURING THE SAME

(71) Applicant: XSENSE TECHNOLOGY CORPORATION, Tortola (VG)

(72) Inventors: Chen-Yu Li, Miaoli County (TW); Chia-Jung Chen, Miaoli County (TW); Yeu-Wen Huang, Miaoli County (TW); Chun-Chung Lin, Miaoli County (TW); Chih-Lung Lin, Miaoli County (TW)

(73) Assignee: XSENSE TECHNOLOGY CORPORATION, Tortola (VG)

( * ) Notice: Subject to any disclaimer, the term of this patent is extended or adjusted under 35 U.S.C. 154(b) by 0 days.

(21) Appl. No.: 16/151,428

(22) Filed: Oct. 4, 2018

(65) Prior Publication Data

US 2019/0124774 A1 Apr. 25, 2019

(30) Foreign Application Priority Data

Oct. 24, 2017 (TW) .............................. 106136526 A (51) Int. Cl.
*H05K 3/00* (2006.01)
*H01L 23/373* (2006.01)
(Continued)

(52) U.S. Cl.
CPC ....... *H05K 3/0061* (2013.01); *H01L 21/4882* (2013.01); *H01L 23/28* (2013.01); *H01L 23/367* (2013.01); *H01L 23/373* (2013.01); *H01L 23/3735* (2013.01); *H01L 23/3736* (2013.01); *H01L 24/03* (2013.01); *H01L 24/33* (2013.01); *H05K 1/0204* (2013.01); *H05K 1/03* (2013.01); *H01L 23/3732* (2013.01)

(58) Field of Classification Search
CPC ...... H05K 1/03; H05K 1/0204; H05K 3/0061; H01L 23/3732; H01L 23/3735; H01L 23/3736; H01L 21/4882; H01L 23/367; H01L 23/28; H01L 23/373; H01L 24/33; H01L 24/03
See application file for complete search history.

(56) References Cited

U.S. PATENT DOCUMENTS

2017/0117438 A1\* 4/2017 Shur ...................... H01L 33/06
2019/0044302 A1\* 2/2019 Kanskar ............. H01S 5/02272

\* cited by examiner

*Primary Examiner* — Jasmine J Clark
(74) *Attorney, Agent, or Firm* — Amin, Turocy & Watson, LLP (57) ABSTRACT

The present disclosure provides an element submount and a method for manufacturing the same. The element submount includes a substrate, a first conductive heat-dissipating layer, a second conductive heat-dissipating layer, a first heat-dissipating layer and an element bonding layer. The substrate has opposite first and second surfaces. The first conductive heat-dissipating layer is formed on the first surface. The second conductive heat-dissipating layer is formed on the first surface and separated from the first conductive heat-dissipating layer. The first heat-dissipating layer is formed on the second surface. The element bonding layer is formed on the second conductive heat-dissipating layer. By electroplating and processing techniques, the edge of one or two sides of the element bonding layer exceeds an edge of the second conductive heat-dissipating layer and partially covers a side of the second conductive heat-dissipating layer.

10 Claims, 8 Drawing Sheets

(51) Int. Cl.
*H01L 21/48* (2006.01)
*H01L 23/28* (2006.01)
*H01L 23/367* (2006.01)
*H01L 23/00* (2006.01)
*H05K 1/02* (2006.01)
*H05K 1/03* (2006.01)

ELEMENT SUBMOUNT AND METHOD FOR MANUFACTURING THE SAME

BACKGROUND

1. Technical Field

The present disclosure relates to manufacturing techniques for a submount for element bonding, and, more particularly, to an element submount and a method for manufacturing the same.

2. Description of Related Art

Bonding between metal layers and elements are usually done by forming a submount/carrier therebetween, in which bonding is achieved by eutectic (e.g., AuSn) soldering. At present, the sputtering technique is often used for forming the bonding layer. However, this tends to lead to uneven composition of the metals (gold and tin), resulting in a lack of uniform migration. Moreover, after a die bonding process or a high-temperature process is performed, poor element bonding or contact may occur due to the uneven migration of the eutectic alloy (AuSn), affecting the stability and performance of the elements.

In the case that a submount is created through sputtering, the finish point of the sputtering process generally ends at an edge of the submount, which may result in a relatively raised region near the finish point. This is called the "edge effect" and may cause voids to be created in the subsequent bonding of elements. These voids reduce contact areas, and air in these voids may impede heat transmission. Both of these degrade the overall heat dissipation. Moreover, the "edge effect" makes the submount uneven, and if the submount is used in optical elements, the raised regions may influence light output during horizontal light output. Planarization technique can be used to eliminate the issue of uneven surfaces, but this adds an additional step and cost to the manufacturing process.

Furthermore, in addition to bonding elements, the submount needs to provide electric conduction and heat dissipation. Typically, miniaturization of the elements is sought after, but this causes shrinking of the heat-dissipating areas, resulting in poorer heat dissipation. In addition, electrically conductive copper layers on a substrate usually increase heat dissipation. From the perspective of thermal diffusion, heat dissipation can be improved by either providing a thin metal (copper) layer having a large heat-dissipating surface area or a thick metal (copper) layer having a small heat-dissipating surface area. However, under the current sputtering process, if thickness of the metal layers is increased, stress becomes an issue, and time cost is also a serious problem.

It is thus difficult for the existing techniques to provide thick heat-dissipating copper layers without stress-related lowering of product yield. Moreover, if the sputtering technique is used for the sake of obtaining better quality, the associated equipment can be expensive, and the cost inevitably becomes higher. Therefore, employing the current techniques in high output applications of 18 W or higher is considered challenging and lacks competitiveness.

Therefore, in view of both element bonding and heat dissipation, there is a need for a submount manufacturing technique that maintains high heat dissipation and product stability at no significant increase in cost.

SUMMARY

The present disclosure is to prevent voids from being formed between the bonding layer and elements during element bonding, since voids degrade heat dissipation. Therefore, the present disclosure provides forming an element bonding layer through electroplating and processing techniques to overcome the "edge effect" issue in the existing sputter technique.

The present disclosure provides an element submount, which may include: a substrate, a first conductive heat-dissipating layer, a second conductive heat-dissipating layer, a first heat-dissipating layer, and an element bonding layer. The substrate may include a first surface and a second surface opposite to the first surface. The first conductive heat-dissipating layer may be formed on the first surface, and the second conductive heat-dissipating layer may be formed on the first surface and separated from the first conductive heat-dissipating layer. The first heat-dissipating layer may be formed on the second surface. The element bonding layer may be formed on the second conductive heat-dissipating layer. In an embodiment, the edge of one or two sides of the element bonding layer extends beyond an edge of the second conductive heat-dissipating layer and partially covers a side of the second conductive heat-dissipating layer.

In an embodiment, the first conductive heat-dissipating layer, the second conductive heat-dissipating layer, and the first heat-dissipating layer may each include a titanium sublayer, a copper sublayer, a nickel sublayer, and a gold sublayer. In another embodiment, the thickness of the copper sublayer can be greater than 40 µm.

In another embodiment, the element bonding layer may include a nickel sublayer, a Flush Au sublayer, a gold-tin (Au—Sn) sublayer, and a gold sublayer, or the element bonding layer includes a platinum sublayer, a Flush Au sublayer, an Au—Sn sublayer, and a gold sublayer. In another embodiment, the substrate may be an aluminum nitride substrate, a silicon substrate, a ceramic substrate or a metal substrate.

In yet another embodiment, the element submount may further include a diamond thin-film layer formed on the first surface and positioned between the substrate and the first conductive heat-dissipating layer and between the substrate and the second conductive heat-dissipating layer. In an embodiment, the first and second conductive heat-dissipating layers may each include a titanium sublayer and a gold sublayer.

The present disclosure further provides a method for manufacturing an element submount, which may include the steps of: providing a substrate including a first surface and a second surface opposite to the first surface; pre-defining conductive and heat-dissipating areas on the first and second surfaces to form a first conductive heat-dissipating layer and a second conductive heat-dissipating layer on the first surface and a first heat-dissipating layer on the second surface; and defining an element bonding area on the second conductive heat-dissipating layer to form an element bonding layer on the second conductive heat-dissipating layer by electroplating.

In an embodiment, the first conductive heat-dissipating layer, the second conductive heat-dissipating layer, and the first heat-dissipating layer may be formed by vapor deposition, sputtering or electroplating.

In an embodiment, the edge of one or two sides of the element bonding layer may extend beyond an edge of the second conductive heat-dissipating layer and partially covers a side of the second conductive heat-dissipating layer.

As compared to the prior art, the element submount and the method for manufacturing the same provided by the present disclosure employ electroplating and processing techniques to allow the edge(s) of one or two sides of the element bonding layer to exceed an edge of the second conductive heat-dissipating layer and partially cover a side of the second conductive heat-dissipating layer. As such, a more planar element bonding layer can be obtained, and voids can be eliminated during element bonding. Also, shading is no longer an issue for optical elements.

Moreover, based on electroplating, the Au—Sn alloy in the element bonding layer can be more evenly distributed, and the thickness of the copper layers in the other conductive layers can be increased, allowing the area of the element bonding layer to be desirably reduced. Therefore, the element submount thus manufactured according to the present disclosure has high bonding reliability, while ensuring good electrical and thermal conductivities without changing the structural compositions or minute adjustments in the structure.

DETAILED DESCRIPTION OF THE EMBODIMENTS

The technical content of the present disclosure is described by the following embodiments. One of ordinary skill in the art can readily understand the advantages and effects of the present disclosure upon reading the disclosure of this specification. The present disclosure may also be practiced or applied using other different embodiments.

Figure 1:
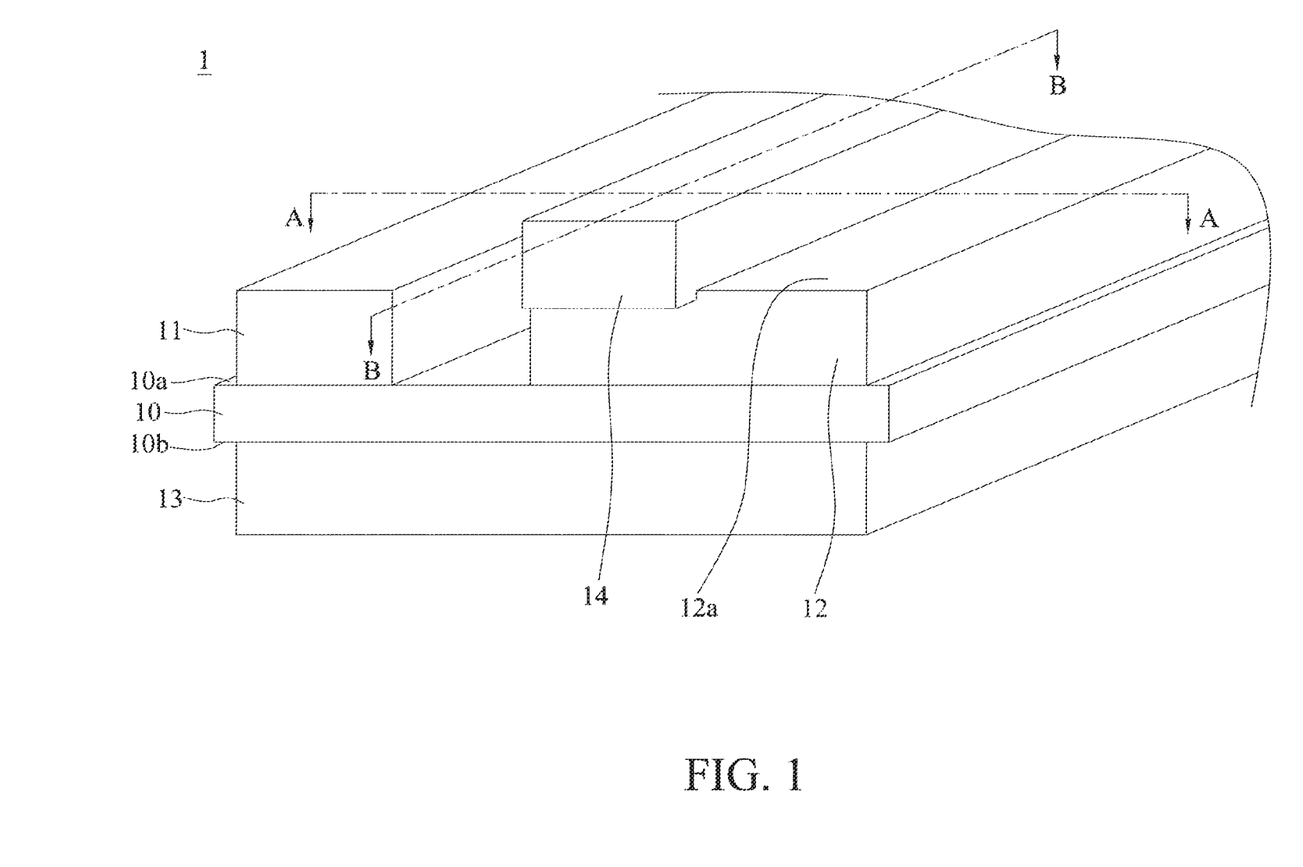
FIG. 1 is a partial, perspective view of an element submount in accordance with an embodiment of the present disclosure.

Referring to FIG. 1, a partial, perspective view of an element submount 1 in accordance with an embodiment of the present disclosure is shown. The element submount 1 includes a substrate 10, a first conductive heat-dissipating layer 11, a second conductive heat-dissipating layer 12, a first heat-dissipating layer 13 and an element bonding layer 14.

The substrate 10 includes a first surface 10a and a second surface 10b opposite to the first surface 10a. The substrate 10 is an electrically insulating layer and can be an aluminum nitride substrate, a silicon substrate, a ceramic substrate (e.g., BN, CN, $Al_2O_3$, $Si_3N_4$, BeO, SiC or GaN), or a metal substrate with a thickness of 0.1±0.05 mm, 0.2±0.05 mm, 0.3±0.05 mm. or greater than 0.3 mm.

The first conductive heat-dissipating layer 11 is formed on the first surface 10a. The second conductive heat-dissipating layer 12 is also formed on the first surface 10a and separated from the first conductive heat-dissipating layer 11. In other words, the first conductive heat-dissipating layer 11 and the second conductive heat-dissipating layer 12 are not directly electrically connected. In an embodiment, the first heat-dissipating layer 13 is formed on the second surface 10b of the substrate 10.

The element bonding layer 14 is formed on the second conductive heat-dissipating layer 12. In an embodiment, the element bonding layer 14 is formed on a top surface 12a of the second conductive heat-dissipating layer 12 away from the substrate 10. In another embodiment, the edge(s) of one or two sides of the element bonding layer 14 exceeds an edge of the second conductive heat-dissipating layer 12 and partially covers a side of the second conductive heat-dissipating layer 12. A side herein means a side face of the second conductive heat-dissipating layer 12, that is, the exposed cross-sectional face of the second conductive heat-dissipating layer 12 parallel to a cross-sectional surface cut along a line A-A in the diagram.

As can be seen, in order to eliminate voids or shading issues created due to the edge effect during the manufacturing of the element bonding layer 14, the present disclosure allows the finish point of the process of forming the element bonding layer 14 not to be on the top surface 12a of the second conductive heat-dissipating layer 12. In other words, the edge of the element bonding layer 14 is not flush with the edge of the top surface 12a of the second conductive heat-dissipating layer 12. The finish point extends further beyond a side of the second conductive heat-dissipating layer 12 to allow the element bonding layer 14 to extend outwardly and downwardly. In other words, the element bonding layer 14 goes beyond an edge of the second conductive heat-dissipating layer 12, such that the element bonding layer 14 extends beyond a side of the second conductive heat-dissipating layer 12 and partially covers a portion of a side face of the second conductive heat-dissipating layer 12. In an embodiment, the downward extension of the element bonding layer 14 is approximately at least 0.5% or more of the thickness of the second conductive heat-dissipating layer 12.

The outward extension from and partial coverage of the second conductive heat-dissipating layer 12 by the element bonding layer 14 can be formed by sputtering and improvements in the processing techniques since seed crystal is present at the side of the second conductive heat-dissipating layer 12. Moreover, as the second conductive heat-dissipating layer 12 extends outwardly, the outwardly-extending metal extends downwards due to the pressure of the water jet during cutting, allowing the side-covering element bonding layer 14 to be formed. This process allows the element bonding layer 14 to protrude outwardly, and the finish point of the electroplating process will end up at the side of the second conductive heat-dissipating layer 12.

As such, the element bonding layer 14 will have a planar surface, which not only improves bonding reliability, but also heat dissipation. This means that the element submount 1 is suitable for high-power applications. Moreover, through electroplating, voids can be eliminated and the distribution of gold and tin in the element bonding layer 14 will be more even than that formed using the sputtering technique, thereby increasing the reliability of thermal conductivity as well as the lifetime of the device.

Figure 2A:
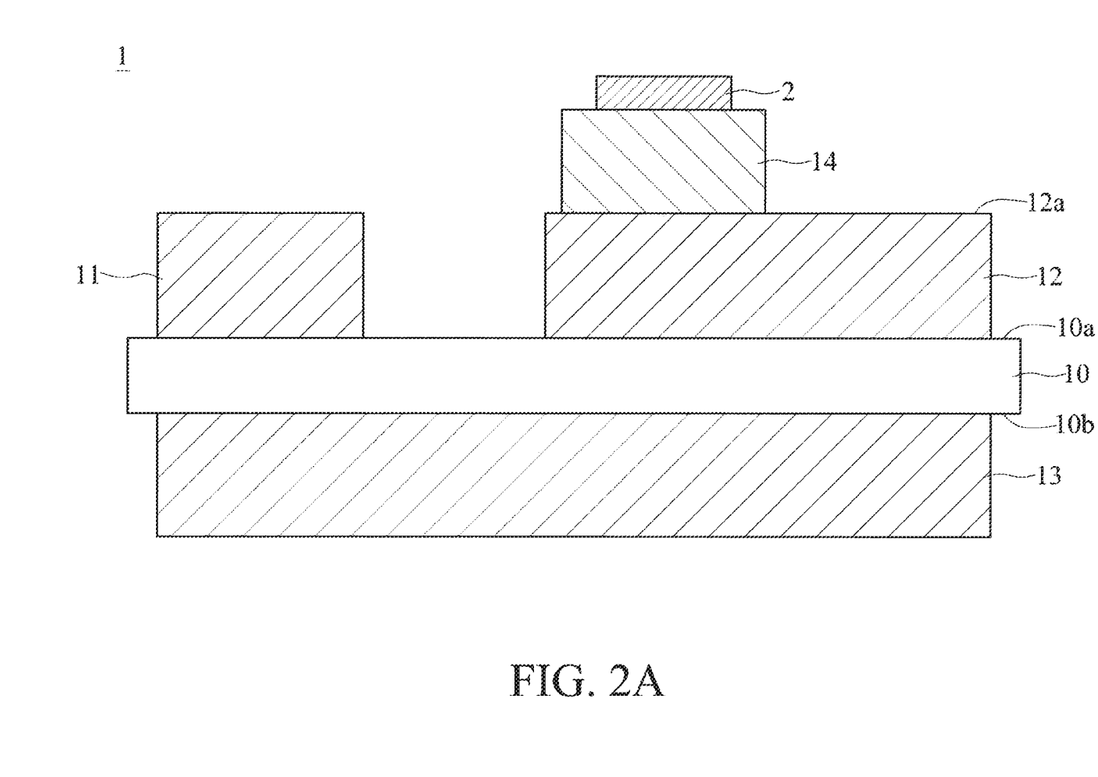
FIGS. 2A and 2B are cross-sectional diagrams depicting the element submount cut along lines A-A and B-B in FIG. 1, respectively, in accordance with a first embodiment of the present disclosure.
Figure 2B:
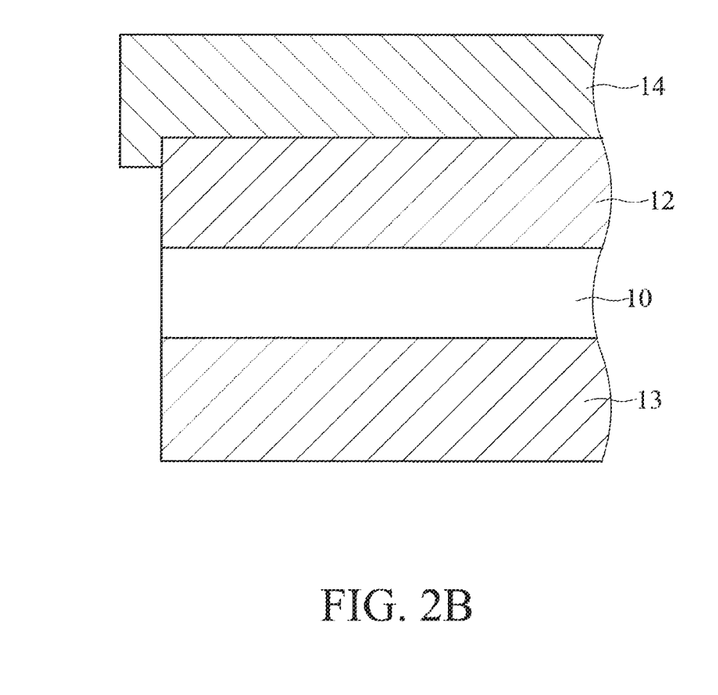

Referring to FIGS. 2A and 2B, cross-sectional diagrams of the element submount cut along lines A-A and B-B in FIG. 1, respectively, in accordance with a first embodiment of the present disclosure are shown. In FIG. 2A, the element submount 1 includes the substrate 10, the first conductive heat-dissipating layer 11 and the second conductive heat-dissipating layer 12 are formed on the top surface of the substrate 10, and the first heat-dissipating layer 13 is formed on the bottom surface of the substrate 10. The element bonding layer 14 is formed on the second conductive heat-dissipating layer 12. An element 2 is further attached on the second conductive heat-dissipating layer 12. The element 2 can be an optical element, an electrical element, an electronic element or a semiconductor element.

The first conductive heat-dissipating layer 11 and the second conductive heat-dissipating layer 12 need to be electrically conductive and thermally conductive at the same time. The first heat-dissipating layer 13 needs to be thermally conductive, and can be electrically conductive depending on the needs. The element bonding layer 14 is similar to the first conductive heat-dissipating layer 11 and the second conductive heat-dissipating layer 12 in that it also needs to be both electrically and thermally conductive.

Furthermore, as the surface of the element bonding layer 14 is flat, there is no limitation on the type of the element 2. In an embodiment, the element 2 is an optical element, an electrical element, an electronic element, a semiconductor element, etc. The present disclosure does not limit the application of the element bonding layer 14. The element bonding layer 14 can be applied to applications with similar requirements.

As shown in FIG. 2B, the element bonding layer 14 is shown to extend outwardly and partially covers a side face of the second conductive heat-dissipating layer 12 when being formed on the second conductive heat-dissipating layer 12. As described above, the edge(s) of one or two sides of the element bonding layer 14 extends beyond the edge(s) of the second conductive heat-dissipating layer 12 and partially covers the side of the second conductive heat-dissipating layer 12. In FIG. 2B, the element bonding layer 14 is shown to have one edge extending beyond an edge of the second conductive heat-dissipating layer 12. In another embodiment, the edges of two sides of the element bonding layer 14 may also extend beyond the corresponding edges of the second conductive heat-dissipating layer 12. In other words, the edge opposite to the currently shown edge of the element bonding layer 14 will also extend beyond the corresponding edge of the second conductive heat-dissipating layer 12 on the opposite side.

Figure 3:
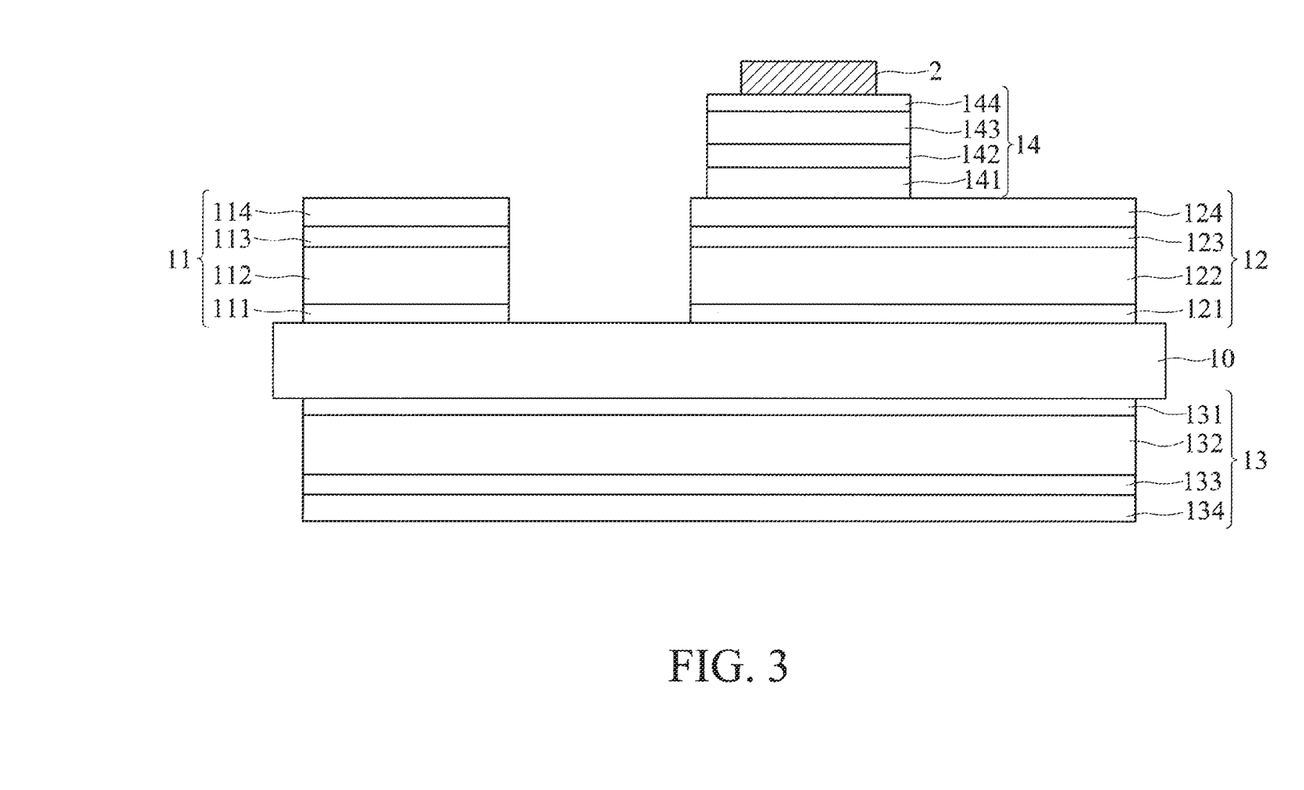
FIG. 3 is a cross-sectional diagram depicting a more detailed view of the element submount of FIG. 2A.

Referring to FIG. 3, a cross-sectional diagram depicting a more detailed view of the element submount of FIG. 2A is shown. The substrate 10, the first conductive heat-dissipating layer 11, the second conductive heat-dissipating layer 12, the first heat-dissipating layer 13, and the element bonding layer 14 of the element submount 1 in this embodiment are similar to those shown in FIG. 2A. In this embodiment, details of each layer are further described.

The first conductive heat-dissipating layer 11 may include a titanium sublayer 111, a copper sublayer 112, a nickel sublayer 113, and a gold sublayer 114 in an order starting from the substrate 10. The second conductive heat-dissipating layer 12 may include a titanium sublayer 121, a copper sublayer 122, a nickel sublayer 123, and a gold sublayer 124 in an order starting from the substrate 10. In an embodiment, the first heat-dissipating layer 13 may include a titanium sublayer 131, a copper sublayer 132, a nickel sublayer 133, and a gold sublayer 134 in the order starting from the substrate 10. It can be understood from the above that the first conductive heat-dissipating layer 11, the second conductive heat-dissipating layer 12 and the first heat-dissipating layer 13 have similar compositions, so they can be formed simultaneously through sputtering, vapor deposition or electroplating. The separation between the first conductive heat-dissipating layer 11 and the second conductive heat-dissipating layer 12 can be achieved through masking. In another embodiment, the titanium sublayer 111, 121, 131 can also be replaced by other metals or alloys, such as, nickel, chromium, tungsten, titanium nitride or titanium tungsten.

In an embodiment, the titanium sublayer 111, 121, 131 (or other metals or alloys such as nickel, chromium, tungsten, titanium nitride or titanium tungsten) can be formed by an electro-beam gun evaporator (E-gun) or sputtering. The copper sublayer 112, 122, 123, the nickel sublayer 113, 123, 133, and the gold sublayer 114, 124, 134 can be formed by electroplating. Since electroplating is used, the thickness of the copper sublayer 112, 122, 123 can be increased, i.e., the thickness of the copper sublayer 112, 122, 123 can be greater than m and up to about 100 μm. As mentioned above, when the thickness of the copper sublayer is increased, the size of the element submount can be reduced. Therefore, electroplating is used to significantly increase the thickness of the copper layer, which is beneficial to heat dissipation.

In an embodiment, the titanium sublayer 111, 121, 131 (or other metals or alloys such as nickel, chromium, tungsten, titanium nitride or titanium tungsten) can have a thickness of 10-10,000 angstrom (Å); the copper sublayer 112, 122, 123 can have a thickness of 75±15 μm; the nickel sublayer 113, 123, 133 can have a thickness of 3-5 μm; and the gold sublayer 114, 124, 134 can have a thickness of 1.3-2 μm.

The element bonding layer 14 may include a nickel sublayer 141, a Flush Au sublayer 142, a gold-tin (Au—Sn) sublayer 143, and a gold sublayer 144 in an order starting from the second conductive heat-dissipating layer 12. In an embodiment, the nickel sublayer 141 is a barrier layer to prevent migration of lower and upper metals towards each other, thereby preventing the loss of the composition of the Au—Sn sublayer, which would adversely affect heat dissipation and element bonding performance.

In an embodiment, the nickel sublayer 141 can have a thickness of 3-5 μm; the Flush Au sublayer 142 can have a thickness of 0.1-0.2 μm; the gold-tin (Au—Sn) sublayer 143 can have a thickness of 3.6-5.4 μm; and the gold sublayer 144 can have a thickness of 0.1-0.2 μm.

In another embodiment, the nickel sublayer 141 can be replaced by a platinum sublayer. The platinum sublayer can have a thickness of about 0.25 μm. This would reduce the thickness of the element bonding layer 14.

Figure 4:
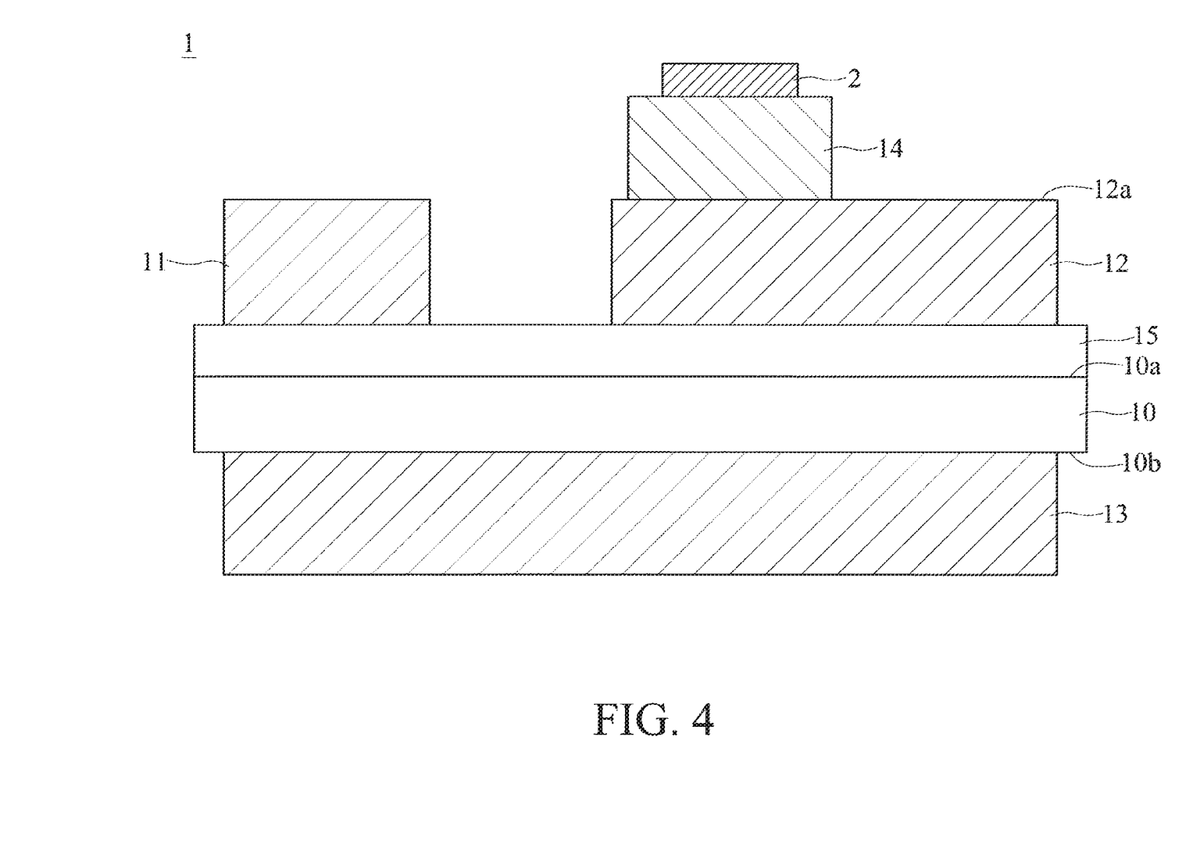
FIG. 4 is a cross-sectional diagram depicting an element submount in accordance with a second embodiment of the present disclosure.

Referring to FIG. 4, a cross-sectional diagram depicting an element submount in accordance with a second embodiment of the present disclosure is shown. A substrate 10, a first conductive heat-dissipating layer 11, a second conductive heat-dissipating layer 12, a first heat-dissipating layer 13, and an element bonding layer 14 of an element submount 1 in the second embodiment are similar to those shown in FIG. 2A, and will not be further illustrated. In the second embodiment, the element submount 1 further includes a diamond thin-film layer 15.

The diamond thin-film layer 15 is formed on the first surface 10a of the substrate 10 and between the substrate 10 and the first conductive heat-dissipating layer 11 and the second conductive heat-dissipating layer 12. Simply, an addition layer of diamond thin-film layer 15 is added to the first surface 10a of the substrate 10 with a thickness that can be greater than 0.3 μm. The heat dissipating coefficient of the diamond thin-film layer 15 is greater than 1,600, much larger than the heat dissipation coefficient of 400 of copper layer.

Therefore, the addition of the diamond thin-film layer 15 on the first surface 10a will lend to improved heat dissipation of the element submount 1.

Figure 5:
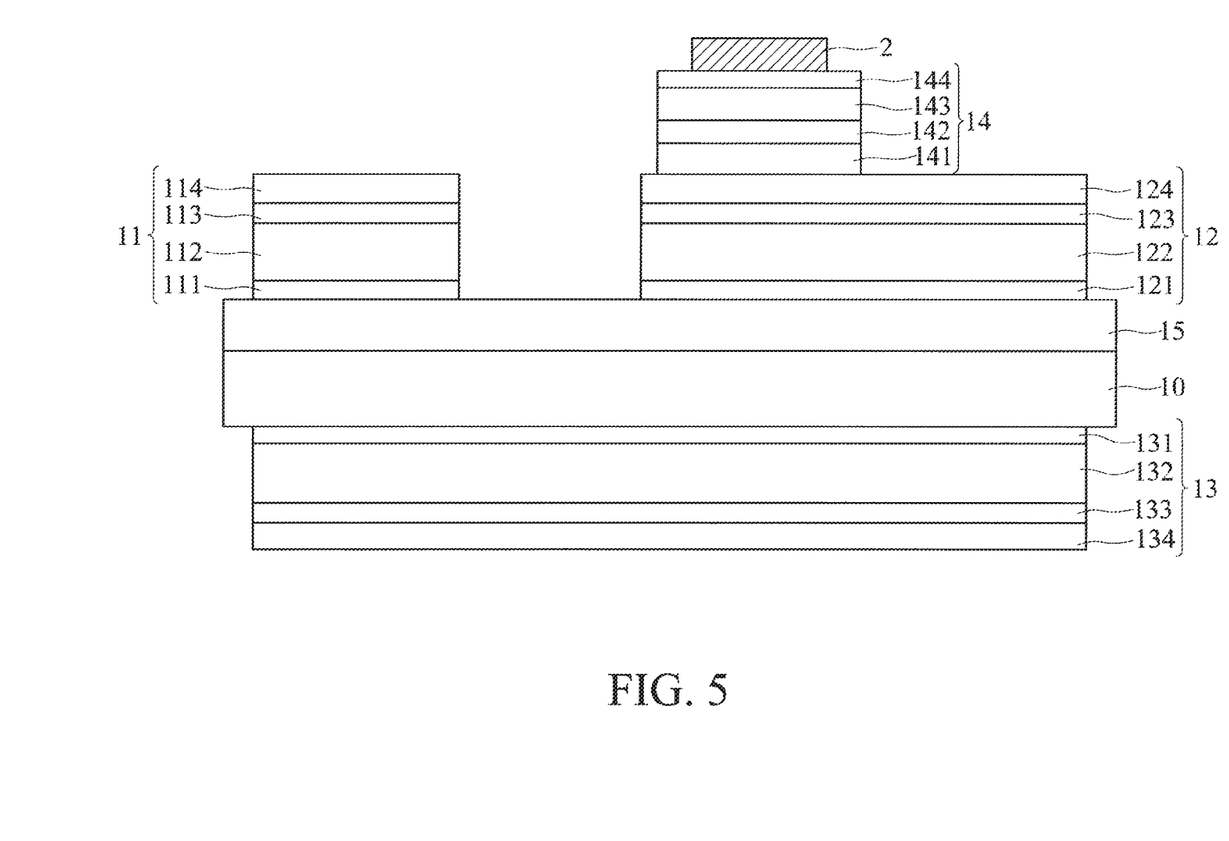
FIG. 5 is a cross-sectional diagram depicting a more detailed view of the element submount of FIG. 4.

Referring to FIG. 5, a cross-sectional diagram depicting a more detailed view of the element submount of FIG. 4 is shown. This embodiment illustrates the detailed compositions of the first conductive heat-dissipating layer 11, the second conductive heat-dissipating layer 12, the first heat-dissipating layer 13, and the element bonding layer 14.

The first conductive heat-dissipating layer 11, the second conductive heat-dissipating layer 12, and the first heat-dissipating layer 13 may each include a titanium sublayer 111, 121, 131, a copper sublayer 112, 122, 123, a nickel sublayer 113, 123, 133, and a gold sublayer 114, 124, 134. In an embodiment, the element bonding layer 14 may include a nickel sublayer 141, a Flush Au sublayer 142, a gold-tin (Au—Sn) sublayer 143, and a gold sublayer 144. In another embodiment, the titanium sublayer 111, 121, 131 can be replaced by other metals or alloys, such as nickel, chromium, tungsten, titanium nitride or titanium tungsten.

In an embodiment, the titanium sublayer 111, 121, 131 (or replaced by other metals or alloys, such as nickel, chromium, tungsten, titanium nitride or titanium tungsten) can be formed by an E-gun or sputtering. The copper sublayer 112, 122, 123, the nickel sublayer 113, 123, 133, and the gold sublayer 114, 124, 134 can be formed by electroplating. Since electroplating is used, the thickness of the copper sublayer 112, 122, 123 can be increased, i.e., to greater than 40 m and up to about 100 μm.

In an embodiment, the titanium sublayer 111, 121, 131 (or replaced by other metals or alloys such as nickel, chromium, tungsten, titanium nitride or titanium tungsten) can have a thickness of 10-10,000 angstrom (A); the copper sublayer 112, 122, 123 can have a thickness of 75±15 μm; the nickel sublayer 113, 123, 133 can have a thickness of 3-5 μm; and the gold sublayer 114, 124, 134 can have a thickness of 1.3-2 μm. Additionally, the nickel sublayer 141 can have a thickness of 3-5 μm; the Flush Au sublayer 142 can have a thickness of 0.1-0.2 μm; the Au—Sn sublayer 143 can have a thickness of 3.6-5.4 μm; and the gold sublayer 144 can have a thickness of 0.1-0.2 μm. In an embodiment, the nickel sublayer 141 can be replaced by a platinum layer.

Figure 6:
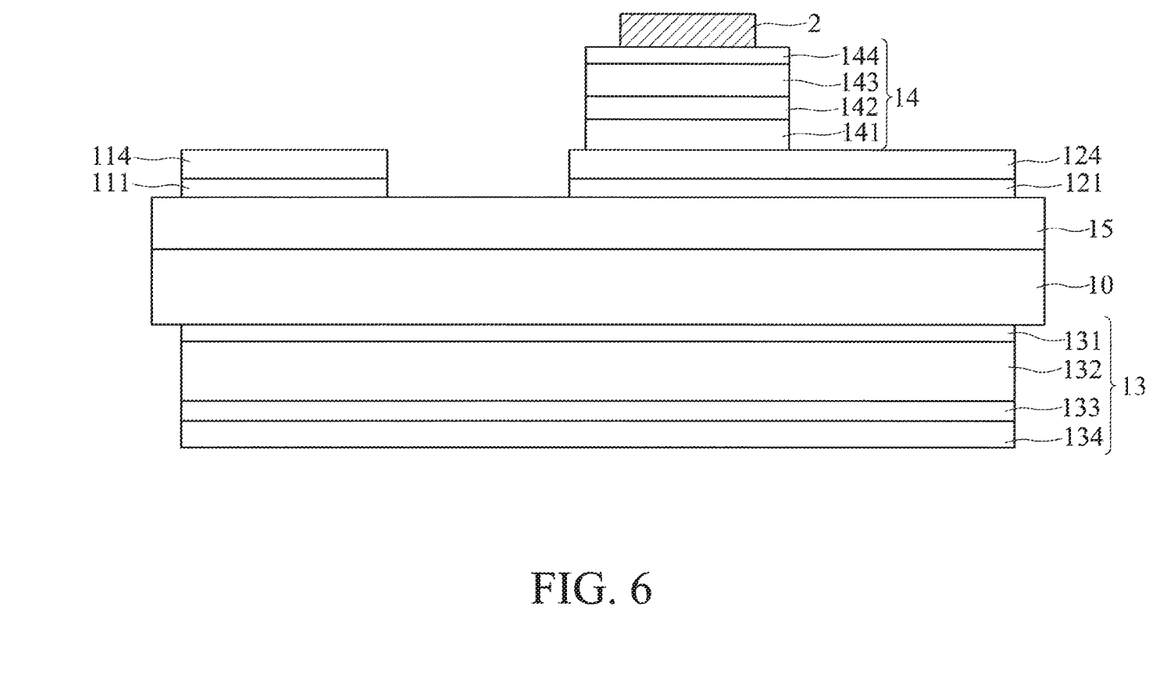
FIG. 6 is a cross-sectional diagram depicting a more detailed view of the element submount of FIG. 4 in accordance with another embodiment of the present disclosure.

Referring to FIG. 6, a cross-sectional diagram depicting a more detailed view of the element submount of FIG. 4 in accordance with another embodiment is shown. In this embodiment, the detailed compositions of the first heat-dissipating layer 13 and the element bonding layer 14 are similar to those shown in FIG. 5. However, the first conductive heat-dissipating layer 11 and the second conductive heat-dissipating layer 12 include no copper layers due to the presence of the diamond thin-film layer 15.

In this embodiment, the first conductive heat-dissipating layer 11 and the second conductive heat-dissipating layer 12 each include a titanium sublayer 111, 121 and a gold sublayer 114, 124. Similarly, the titanium sublayer 111, 121 can also be replaced by other metals or alloys, such as nickel, chromium, tungsten, titanium nitride or titanium tungsten. As described before, the diamond thin-film layer 15 provides better heat dissipation, and copper sublayers in the first conductive heat-dissipating layer 11 and the second conductive heat-dissipating layer 12 can be omitted to reduce the overall thickness.

Figure 7:
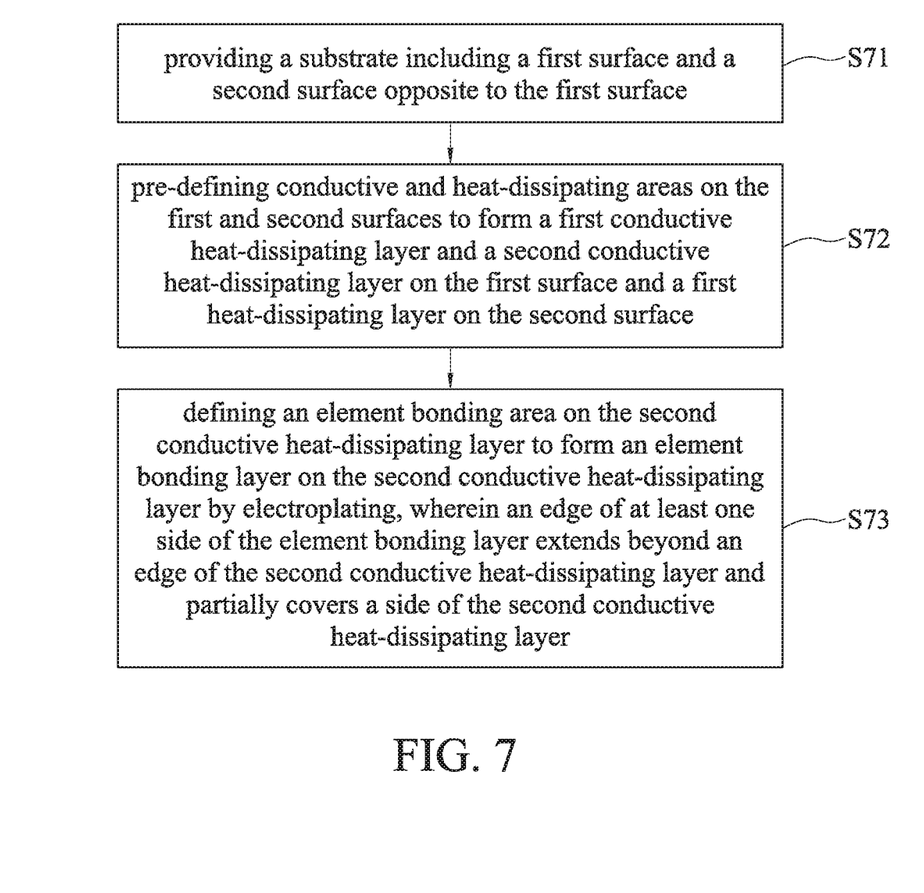
FIG. 7 is a flowchart illustrating a method for manufacturing an element submount in accordance with an embodiment of the present disclosure.

Referring to FIG. 7, a flowchart illustrating a method for manufacturing an element submount in accordance with an embodiment of the present disclosure is shown. In step S71, a substrate is provided. The substrate can be an aluminum nitride substrate, a silicon substrate, a ceramic substrate (e.g., BN, CN, $Al_2O_3$, $Si_3N_4$, BeO, SiC or GaN), or a metal substrate.

In step S72, electrically conductive and heat-dissipating areas are pre-defined on a first surface and a second surface of the substrate, so as to form a first conductive heat-dissipating layer and a second conductive heat-dissipating layer on the first surface and a first heat-dissipating layer on the second surface. In an embodiment, the first conductive heat-dissipating layer, the second conductive heat-dissipating layer, and the first heat-dissipating layer can be formed by vapor deposition, sputter or electroplating. Since the compositions of the first conductive heat-dissipating layer, the second conductive heat-dissipating layer, and the first heat-dissipating layer are similar, they can be simultaneously formed.

In step S73, an area for element bonding is defined on the second conductive heat-dissipating layer, and an element bonding layer is formed on the second conductive heat-dissipating layer through electroplating. It should be noted that in view of the edge effect created by conventional manufacturing methods, electroplating and improvements in the processing techniques are provided by the present disclosure that results in the edge(s) of one or two sides of the element bonding layer to exceed an edge of the second conductive heat-dissipating layer and partially cover a side of the second conductive heat-dissipating layer. As such, voids can be eliminated as now the second conductive heat-dissipating layer has a more uniform thickness.

In conclusion, in the element submount provided by the present disclosure, through electroplating and improvements in the processing techniques, the edge(s) of one or two sides of the element bonding layer exceeds an edge of the second conductive heat-dissipating layer and partially covers a side of the second conductive heat-dissipating layer, resulting in a more planar element bonding layer. Moreover, based on electroplating, the Au—Sn alloy in the element bonding layer can be more evenly distributed and the thickness of the copper layers in the other conductive layers can be increased, allowing the area of the element bonding layer to be reduced. If a diamond thin-film layer is further added, even better heat dissipation can be achieved. Compared to the prior art, the element submount of the present disclosure has better electrical and thermal conductivities.

The above embodiments are used only to illustrate the principles of the present disclosure and its effect, rather than to limit the present disclosure. The above embodiments can be modified by one of ordinary skill in the art without departing from the spirit and scope of the present disclosure. Therefore, the scope claimed of the present disclosure should be defined by the following claims.

What is claimed is:
1. An element submount, comprising:
a substrate including a first surface and a second surface opposite to the first surface;
a first conductive heat-dissipating layer formed on the first surface;
a second conductive heat-dissipating layer formed on the first surface and separated from the first conductive heat-dissipating layer;
a first heat-dissipating layer formed on the second surface; and
an element bonding layer formed on the second conductive heat-dissipating layer, wherein an edge of at least one side of the element bonding layer extends beyond an edge of the second conductive heat-dissipating layer and partially covers a side of the second conductive heat-dissipating layer.

2. The element submount of claim 1, wherein the first conductive heat-dissipating layer, the second conductive heat-dissipating layer, and the first heat-dissipating layer each include a titanium sublayer, a copper sublayer, a nickel sublayer, and a gold sublayer.

3. The element submount of claim 2, wherein the copper sublayer is greater than 40 μm in thickness.

4. The element submount of claim 1, wherein the element bonding layer includes a nickel sublayer, another element bonding layer, a gold-tin (Au-Sn) sublayer, and a gold sublayer.

5. The element submount of claim 1, wherein the element bonding layer includes a platinum sublayer, another element bonding layer, an Au-Sn sublayer, and a gold sublayer.

6. The element submount of claim 1, wherein the substrate is an aluminum nitride substrate, a silicon substrate, a ceramic substrate, or a metal substrate.

7. The element submount of claim 1, further comprising a diamond thin-film layer formed on the first surface and positioned between the substrate and the first conductive heat-dissipating layer and between the substrate and the second conductive heat-dissipating layer.

8. The element submount of claim 7, wherein the first and second conductive heat-dissipating layers each include a titanium sublayer and a gold sublayer.

9. A method for manufacturing an element submount, comprising:
providing a substrate including a first surface and a second surface opposite to the first surface;
pre-defining conductive and heat-dissipating areas on the first and second surfaces to form a first conductive heat-dissipating layer and a second conductive heat-dissipating layer on the first surface and a first heat-dissipating layer on the second surface; and
defining an element bonding area on the second conductive heat-dissipating layer to form an element bonding layer on the second conductive heat-dissipating layer by electroplating, wherein an edge of at least one side of the element bonding layer extends beyond an edge of the second conductive heat-dissipating layer and partially covers a side of the second conductive heat-dissipating layer.

10. The method of claim 9, wherein the first conductive heat-dissipating layer, the second conductive heat-dissipating layer, and the first heat-dissipating layer are formed by vapor deposition, sputtering or electroplating.

* * * * *